United States Patent
Findlater et al.

(10) Patent No.: US 7,049,168 B2
(45) Date of Patent: May 23, 2006

(54) IMAGE SENSOR COMPRISING A PIXEL ARRAY HAVING AN OPTICAL ELEMENT POSITIONED RELATIVE TO EACH PIXEL

(75) Inventors: Keith Findlater, Edinburgh (GB); Ewan Findlay, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 0 days.

(21) Appl. No.: 10/856,128

(22) Filed: May 28, 2004

(65) Prior Publication Data

US 2005/0266603 A1    Dec. 1, 2005

(51) Int. Cl.
*H01L 21/00* (2006.01)

(52) U.S. Cl. ............................ 438/69; 438/29; 438/57; 438/66

(58) Field of Classification Search ..................... None
See application file for complete search history.

(56) References Cited

U.S. PATENT DOCUMENTS

| | | | |
|---|---|---|---|
| 5,610,390 A | 3/1997 | Miyano | 250/216 |
| 5,633,203 A * | 5/1997 | Adair | 438/66 |
| 6,008,511 A | 12/1999 | Tokumitsu et al. | 257/232 |
| 6,014,232 A * | 1/2000 | Clarke | 358/482 |
| 6,312,969 B1 * | 11/2001 | Abe | 438/31 |
| 6,638,786 B1 * | 10/2003 | Yamamoto | 438/57 |
| 2004/0082093 A1 * | 4/2004 | Yamamoto | 438/57 |

* cited by examiner

*Primary Examiner*—Luan Thai
(74) *Attorney, Agent, or Firm*—Lisa K. Jorgenson; Allen, Dyer, Doppelt, Milbrath & Gilchrist, P.A.

(57) ABSTRACT

A method for manufacturing an image sensor including an array of pixels and an imaging lens exit pupil for focusing rays of light onto the array of pixels is provided. Each pixel includes a light sensitive region and at least one optical element associated therewith. The method includes positioning the at least one optical element for each pixel relative to its associated light sensitive region based upon a range of acceptable angles of incidence for the rays of light from the imaging lens exit pupil.

26 Claims, 4 Drawing Sheets

IMAGE SENSOR COMPRISING A PIXEL ARRAY HAVING AN OPTICAL ELEMENT POSITIONED RELATIVE TO EACH PIXEL

FIELD OF THE INVENTION

The present invention relates to an image sensor comprising a pixel array having an optical element positioned relative to each pixel.

BACKGROUND OF THE INVENTION

In modern image sensors, especially in mobile applications, there is a requirement to reduce the physical size of the complete system. At the same time, resolution and image quality must be maintained or improved.

Typically, an image sensor comprises a main imaging lens which focuses rays of light onto a pixel array on a substrate. The intensity of the rays of light impinging on each pixel is read out to memory, and an image is generated from the values of each pixel. In addition, to enable color imaging, a color filter is placed above each pixel.

To maintain sensitivity and hence image quality, image sensors employ micro-lenses above each pixel to concentrate the incident light on the sensitive part of each pixel. However, to enable the image sensor size to be reduced, the focal length of the main imaging lens also needs to be reduced. Consequently, for the same physical size of the pixel array, the light from the main imaging lens has an increased angle of incidence at the periphery of the pixel array.

When the ray angles are increased this results in a loss of sensitivity, and hence relative illumination across the pixel field, and also increased color cross-talk between pixels. This degrades signal-to-noise ratio and color purity. Color cross-talk is primarily caused by an angled ray passing through a given color filter but arriving at the sensitive part of a neighboring pixel. As the vertical distance from the pixel photodiodes to the color filter elements is set, increasing ray angles accentuates this problem. There is also a contribution to the color cross-talk from reflected and scattered rays from the metal layers of the pixel. Again, the color cross-talk contribution from reflected and scattered rays is increased as the ray angles increase.

U.S. Pat. No. 5,610,390 describes a method to position micro-lenses according to a function of an imaging lens exit pupil and pixel position. U.S. Pat. No. 6,008,511 describes a method to position micro-lenses according to a function which incorporates the particular color of the pixel in question. The prior art systems recognize that offsetting the micro-lens in relation to the pixel can compensate for the increased angle of incidence of rays of light impinging on the pixel array.

However, when the angle of incidence of rays of light are large the micro-lens may be required to be moved a relatively large distance. This can result in the micro-lens being placed above a metal routing of the pixel rather than the light sensitive region. By placing the micro-lens above the metal routing, the micro-lens light amplification effect is reduced as some of the focused rays are reflected off the metal. In addition, the metal routing is naturally opaque, and due to the positioning of the micro-lens, may prevent the rays from reaching the light sensitive region of the pixel.

SUMMARY OF THE INVENTION

An object of the present invention is to obviate or mitigate the relative illumination loss and cross-talk associated with positioning micro-lenses and color filters at the pixel level.

According to a first aspect of the present invention, a method for manufacturing an image sensor comprising an array of pixels and an imaging lens for focusing rays of light onto the array of pixels is provided. Each pixel comprises a light sensitive region and at least one optical element.

The at least one optical element may have a range of acceptable angles of incidence of rays of light from the imaging lens. For each pixel, the at least one optical element may be positioned relative to the light sensitive region in accordance with the range of acceptable angles. The range of acceptable angles of incidence may be dependent on the optical element technology, and the permitted range of relative sensitivities that are desired from the image sensor.

The at least one optical element may be positioned relative to the light sensitive region according to a radial movement towards the center of the pixel array. Such a radial movement may be used to correctly position a circular imaging lens. Since other types of imaging lens could be used, the direction of movement would be altered appropriately. Furthermore, a pixel array is normally rectangular in shape even though a radial movement is applied. Other shapes of pixel arrays could also be envisaged.

The range of acceptable angles of incidence may be used to calculate an effective sensitivity exit pupil position. The effective sensitivity exit pupil position may be calculated by dividing the maximum radial position of a pixel from the center of the array of pixels by an incident angle within the range of acceptable angles of incidence.

For each pixel, the radial movement may be calculated according to a function of the height of the at least one optical element from the pixel, a first angle between the imaging lens exit pupil and the light sensitive region, and a second angle is between the effective sensitivity exit pupil position and the light sensitive region.

The image sensor may also have at least one dielectric layer between each pixel and each optical element. The at least one optical element and the first and second angles may be modified to include any refractive properties of the at least one dielectric layer.

The at least one optical element may comprise a micro-lens. The range of acceptable angles of incidence of the micro-lens may be the micro-lens' measured angular response thereof. The at least one optical element may also comprise a color filter.

According to a second aspect of the present invention, a method for manufacturing an optical pointing device comprising an image sensor as defined above is provided.

According to a third aspect of the present invention, a method for manufacturing a mobile device, such as a wireless communication system, comprising an image sensor as defined above is also provided.

BRIEF DESCRIPTION OF THE DRAWINGS

Embodiments of the present invention will now be described with reference to the accompanying drawings, in which.

DETAILED DESCRIPTION OF THE PREFERRED EMBODIMENTS

Figure 1:
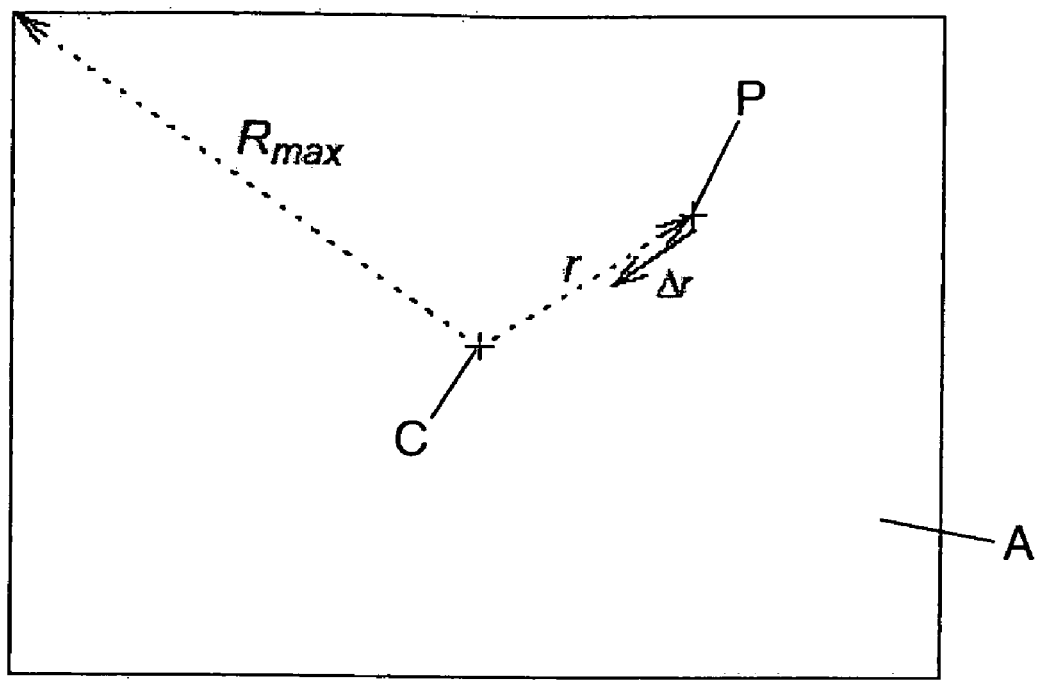
FIG. 1 shows a schematic diagram of an array of pixels in accordance with the present invention.

In the following description references to a pixel correspond to a pixel's light sensitive region rather than any additional components within the pixel. Referring to FIG. 1, a radial shift Δr of a micro-lens M (FIG. 2) of a pixel P at a certain radial distance r from a pixel array A having a center C is to be calculated.

The micro-lens is sensitive to incoming rays of light over a range of angles of incidence $\phi_{sense}$. Outside the range of angles of incidence $\phi_{sense}$, rays of light are not focused effectively below the micro-lens. The maximum radial distance from the pixel array center C of a pixel P is defined as $R_{max}$ (as shown in FIG. 1) and is calculated as follows:

$$R_{max} = \sqrt{\left(\frac{x_p N_x}{2}\right)^2 + \left(\frac{x_p N_y}{2}\right)^2}$$

where $x_p$ is the pixel pitch, and $N_x$ and $N_y$ are the horizontal and vertical dimensions of the pixel array expressed in pixels.

An effective sensitivity exit pupil position for the micro-lens can then be defined as $E_s$ and is given by:

$$E_s = \frac{R_{max}}{\tan\phi_{sense}}.$$

Figure 2:
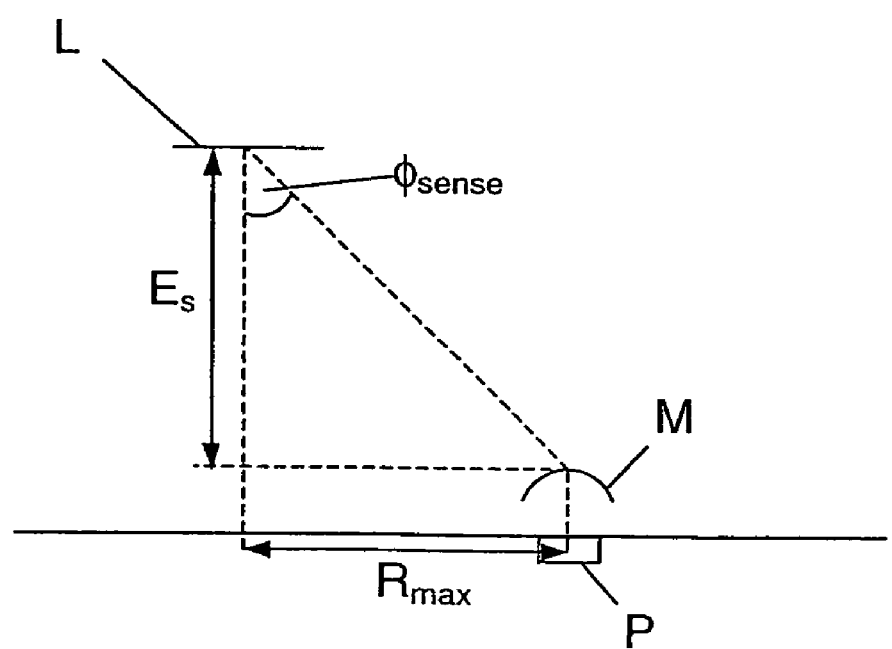
FIG. 2 shows a schematic diagram illustrating calculation of the range of acceptance angles of incidence for a micro-lens in accordance with the present invention.

Referring to FIG. 2, $E_s$ is the vertical distance from an imaging lens exit pupil L to the micro-lens M which continues to provide effective sensitivity to the pixel P.

Figure 3:
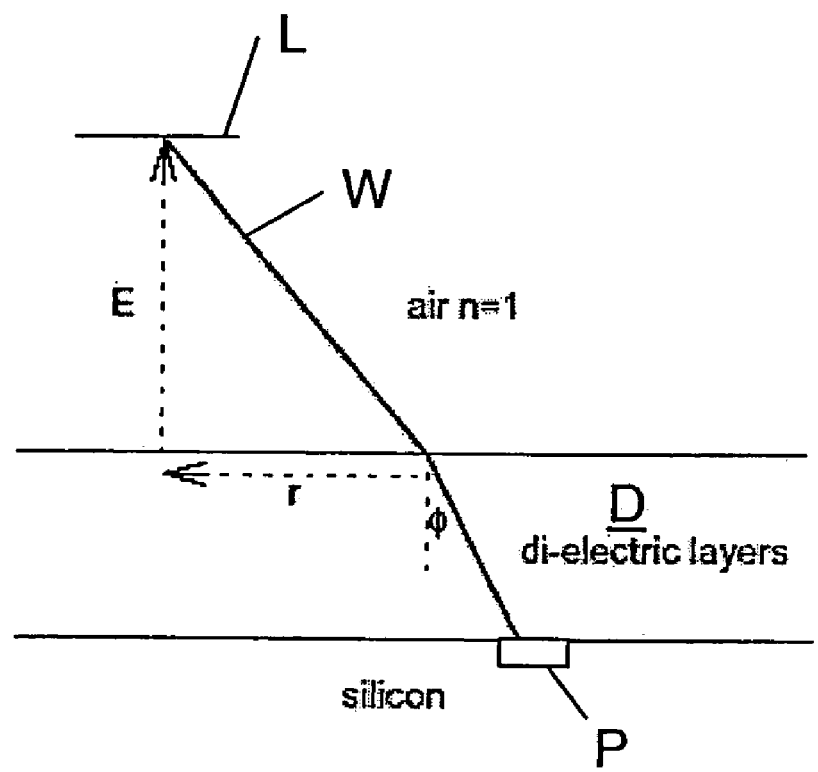
FIG. 3 shows a schematic diagram of a ray of light within an image sensor between an imaging lens exit pupil and a pixel in accordance with the present invention.

Referring to FIG. 3, a first angle φ represents the angle from the imaging lens exit pupil L to the pixel P of a ray of light W. A number of dielectric layers D are present above the pixel P. The first angle φ also incorporates the refraction of the ray W as a result of entering the dielectric layers D which has an average refractive index of $n_d$. The distance from the dielectric layers D to the imaging lens exit pupil L is given as E.

The first angle φ is calculated as follows:

$$\phi = \arcsin\left(\frac{r}{n_d\sqrt{r^2 + E^2}}\right).$$

Figure 4:
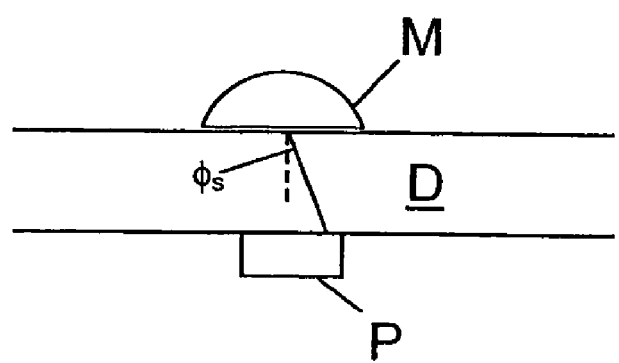
FIG. 4 shows a schematic diagram of a ray of light within an image sensor between a micro-lens and a pixel in accordance with the present invention.

Similarly, as shown in FIG. 4, a second angle $\phi_s$ represents the angle from the micro-lens to the pixel, when the imaging lens exit pupil L is at a distance equal to the effective sensitivity position $E_s$.

The second angle $\phi_s$ incorporates the refraction of the ray W as a result of entering the dielectric layers D which has an average refractive index of $n_d$. The second angle $\phi_s$ is calculated as follows:

$$\phi_s = \arcsin\left(\frac{r}{n_d\sqrt{r^2 + E_s^2}}\right).$$

Figure 5:
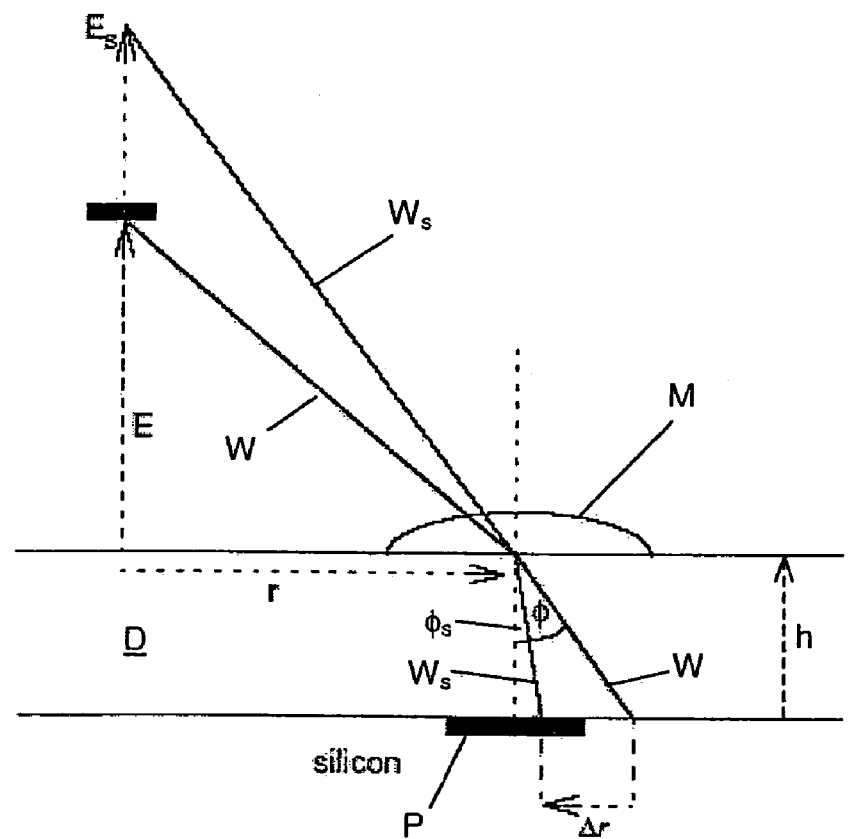
FIG. 5 shows a schematic diagram of the calculation of the distance Δr in accordance with the present invention.

Referring to FIG. 5, the radial shift Δr is the shift of the micro-lens M required to take into account the difference between the first angle φ and the second angle $\phi_s$ while considering a height h from the micro-lens M to the pixel P. The ray $W_s$ represents the light that would travel from the effective sensitivity exit pupil position $E_s$. The ray W represents the light that would travel from the imaging lens exit pupil L. For each pixel P at a distance r, the radial shift Δr of the micro-lens M towards the center C of the pixel array A can be calculated.

In FIG. 5 the micro-lens M is shown in its unshifted position. The radial shift Δr is therefore calculated as follows:

$$\Delta r = h(\tan\phi - \tan\phi_s).$$

Δr, once calculated, can easily be split into horizontal and vertical distances by using the angle from the pixel of interest to the center of the array.

Figure 6:
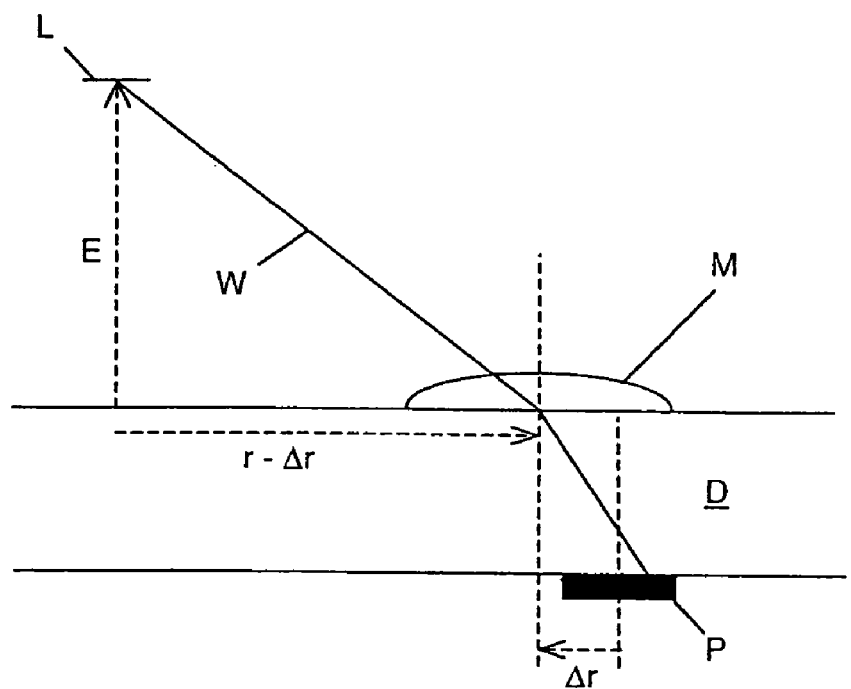
FIG. 6 shows a schematic diagram of the micro-lens positioned according to the calculation of the distance Δr in accordance with the present invention.

Referring to FIG. 6, the micro-lens M is now shown shifted a distance Δr towards the center of the pixel array. The ray W is refracted towards the pixel P. It should be noted that the micro-lens M does not necessarily focus light at the center of the light sensitive regions of the pixel P.

A pixel requires measurement of the amount of impinging light, and is not concerned with the position of the light inside the light sensitive region. By including the angle of incidence $\phi_{sense}$ of the micro-lens, the radial shift Δr of the micro-lens is reduced as compared to prior art calculations. This is particularly noticeable when there is a large first angle φ, as the radial shift Δr for micro-lenses at the extremities of the array of pixels is reduced considerably. By reducing the required radial shift Δr there is a reduced chance that micro-lenses are positioned over metal layers within a pixel without reducing the sensitivity of the pixel. As the micro-lenses are less likely to be over metal layers the intensity of light received by the photosensitive part of the pixel can actually be improved for micro-lenses with large radial shifts.

By including a parameter in the calculation of the radial shift Δr for the angle of incidence $\phi_{sense}$ of the micro-lens, the focused point of the micro-lens changes across the pixel array. While this might seem like a disadvantage, the spot can move by a significant proportion within a pixel and still produce an acceptable response. By allowing the spot to move, the micro-lens radial shift Δr for large first angles (φ) can be reduced, which prevents the problems of moving the micro-lens too far over the pixel metal routing layers.

The micro-lens effectiveness for different acceptance angles of incidence $\phi_{sense}$ can be measured by optical characterization using collimated light, varying the angle of the illumination and measuring the response. A designer of an image sensor can decide what is the best trade-off between the acceptance angle parameter of the micro-lens and the total shift of the micro-lens for extreme ray angles.

It should be appreciated that a micro-lens is one example of an optical element that can be positioned according to the present invention. Other optical elements can also be positioned to improve performance of a pixel array. For example, color filter elements can also be positioned according to the present invention. It is possible to have an image sensor with more than one optical element positioned, such as both a color filter and a micro-lens. It is also possible to position only one optical element, such as a micro-lens without a color filter or a color filter without a micro-lens, depending on the application.

Figure 7:
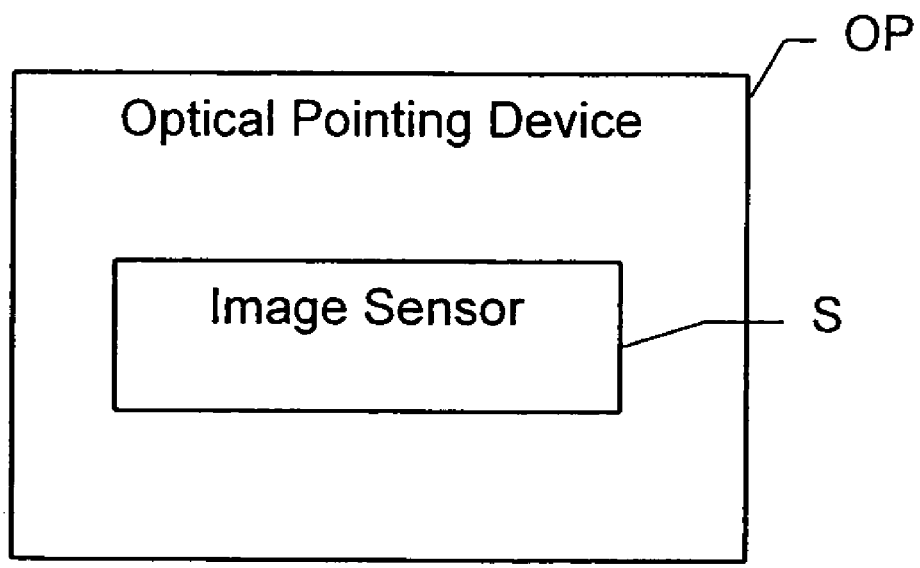
FIG. 7 is a block diagram of an optical pointing device comprising an image sensor in accordance with the present invention.

Referring to FIG. 7, another aspect of the present invention is directed to a method for manufacturing an optical pointing device OP comprising an image sensor S as defined above. The method comprises determining a range of acceptable angles of incidence for the rays of light from the imaging lens exit pupil L, and calculating movement for the at least one optical element M for each pixel towards a center of the array of pixels A.

The calculation is based upon a height of the at least one optical element M from its associated light sensitive region, a first angle $\phi$ between the imaging lens exit pupil L and the associated light sensitive region, and a second angle $\phi_s$ between the imaging lens exit pupil corresponding to an effective sensitivity exit pupil position. The at least one optical element M for each pixel P is positioned relative to the calculated movement.

Figure 8:
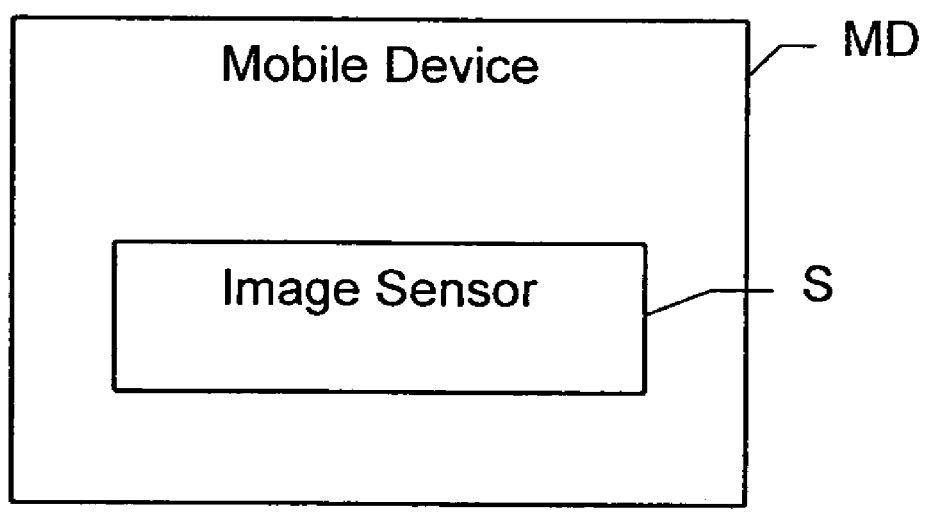
FIG. 8 is a block diagram of a mobile device comprising an image sensor in accordance with the present invention

Another aspect of the present invention is directed to a method for manufacturing a mobile device MD comprising an image sensor S as defined above, as illustrated in FIG. 8. The mobile device MD may be a wireless communication system, such as a cellular telephone, for example.

That which is claimed is:

1. A method for manufacturing an image sensor comprising an array of pixels and an imaging lens exit pupil for focusing rays of light onto the array of pixels, each pixel comprising a light sensitive region and at least one optical element associated therewith, the method comprising:
    positioning the at least one optical element for each pixel relative to its associated light sensitive region based upon a range of acceptable angles of incidence for the rays of light from the imaging lens exit pupil, and based upon a height of a bottom surface of the at least one optical element from a top surface of its associated light sensitive region.

2. A method according to claim 1, wherein the at least one optical element for each pixel is positioned according to a radial movement towards a center of the array of pixels.

3. A method according to claim 2, wherein the radial movement for each pixel is calculated based upon the height of the at least one optical element from its associated light sensitive region, a first angle between the imaging lens exit pupil and the associated light sensitive region, and a second angle between the imaging lens exit pupil corresponding to an effective sensitivity exit pupil position.

4. A method according to claim 3, wherein the image sensor comprises at least one dielectric layer between each pixel and each optical element, the first and second angles being redefined to include refractive properties of the at least one dielectric layer.

5. A method according to claim 1, wherein the range of acceptable angles of incidence for each pixel is used to calculate an effective sensitivity exit pupil position by dividing a predetermined radial position of a pixel from a center of the array of pixels by an incident angle within the range of acceptable angles of incidence.

6. A method according the claim 1, wherein the at least one optical element comprises a micro-lens.

7. A method according to claim 6, wherein the range of acceptable angles of incidence of each micro-lens is a measured angular response thereof.

8. A method according to claim 1, wherein the at least one optical element comprises a color filter.

9. A method for manufacturing an image sensor comprising an array of pixels and an imaging lens exit pupil for focusing rays of light onto the array of pixels, each pixel comprising a light sensitive region and at least one optical element associated therewith, the method comprising:
    determining a range of acceptable angles of incidence for the rays of light from the imaging lens exit pupil with respect to each optical element;
    calculating a radial movement for each optical element towards a center of the array of pixels based upon a height of a bottom surface of the optical element from a top surface of its associated light sensitive region, a first angle between the imaging lens exit pupil and the associated light sensitive region, and a second angle between the imaging lens exit pupil corresponding to an effective sensitivity exit pupil position; and
    positioning each optical element according to the calculated radial movement.

10. A method according to claim 9, wherein the range of acceptable angles of incidence for each optical element is used to calculate the effective sensitivity exit pupil position by dividing a predetermined radial position of a pixel from the center of the array of pixels by an incident angle within the range of acceptable angles of incidence.

11. A method according to claim 9, wherein the image sensor comprises at least one dielectric layer between each pixel and each optical element, the first and second angles being redefined to include refractive properties of the at least one dielectric layer.

12. A method according to claim 9, wherein each optical element comprises a micro-lens.

13. A method according to claim 12, wherein the range of acceptable angles of incidence of each micro-lens is a measured angular response thereof.

14. A method according to claim 9, wherein each optical element comprises a color filter.

15. A method for manufacturing an optical pointing device comprising an image sensor comprising an array of pixels and an imaging lens exit pupil for focusing rays of light onto the array of pixels, each pixel comprising a light sensitive region and at least one optical element associated therewith, the method comprising:
    determining a range of acceptable angles of incidence for the rays of light from the imaging lens exit pupil with respect to each optical element;
    calculating movement for each optical element with respect to its associated light sensitive region based upon a height of a bottom surface of the optical element from a top surface of its associated light sensitive region, a first angle between the imaging lens exit pupil and the associated light sensitive region, and a second angle between the imaging lens exit pupil corresponding to an effective sensitivity exit pupil position; and
    positioning each optical element according to the calculated movement.

16. A method according to claim 15, wherein the calculated movement is a radial movement towards a center of the array of pixels.

17. A method according to claim 16, wherein the range of acceptable angles of incidence for each optical element is used to calculate the effective sensitivity exit pupil position by dividing a predetermined radial position of a pixel from the center of the array of pixels by an incident angle within the range of acceptable angles of incidence.

18. A method according to claim 15, wherein the image sensor comprises at least one dielectric layer between each pixel and each optical element, the first and second angles being redefined to include refractive properties of the at least one dielectric layer.

19. A method according to claim 15, wherein each optical element comprises a micro-lens.

20. A method according to claim 15, wherein each optical element comprises a color filter.

21. A method for manufacturing a mobile device comprising an image sensor comprising an array of pixels and an imaging lens exit pupil for focusing rays of light onto the array of pixels, each pixel comprising a light sensitive region and at least one optical element associated therewith, the method comprising:
  determining a range of acceptable angles of incidence for the rays of light from the imaging lens exit pupil with respect to each optical element;
  calculating movement for each optical element with respect to it associated light sensitive region based upon a height of a bottom surface of the optical element from a top surface of its associated light sensitive region, a first angle between the imaging lens exit pupil and the associated light sensitive region, and a second angle between the imaging lens exit pupil corresponding to an effective sensitivity exit pupil position; and
  positioning each optical element according to the calculated movement.

22. A method according to claim 21, wherein the calculated movement is a radial movement towards a center of the array of pixels.

23. A method according to claim 22, wherein the range of acceptable angles of incidence for each optical element is used to calculate the effective sensitivity exit pupil position by dividing a predetermined radial position of a pixel from the center of the array of pixels by an incident angle within the range of acceptable angles of incidence.

24. A method according to claim 21, wherein the image sensor comprises at least one dielectric layer between each pixel and each optical element, the first and second angles being redefined to include refractive properties of the at least one dielectric layer.

25. A method according to claim 21, wherein each optical element comprises a micro-lens.

26. A method according to claim 21, wherein each optical element comprises a color filter.

* * * * *